US010861685B2

(12) United States Patent
Lee et al.

(10) Patent No.: US 10,861,685 B2
(45) Date of Patent: Dec. 8, 2020

(54) FLUORO-BASED POLYMER COMPOSITE TARGET FOR SPUTTERING

(71) Applicant: KOREA RESEARCH INSTITUTE OF CHEMICAL TECHNOLOGY, Daejeon (KR)

(72) Inventors: Sang Jin Lee, Daejeon (KR); Jae Heung Lee, Daejeon (KR); Woo Jin Choi, Daejeon (KR); Cheol Hwan Kim, Gyeongsangnam-do (KR); Sung Hyun Kim, Gyeongsangnam-do (KR); Seong Geun Cho, Daejeon (KR); Dong Seok Ham, Daejeon (KR); Kwang Je Kim, Chungcheongnam-do (KR); Dong Soon Park, Daejeon (KR); Jae Seong Park, Daejeon (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 145 days.

(21) Appl. No.: 15/547,015

(22) PCT Filed: Jan. 28, 2016

(86) PCT No.: PCT/KR2016/000927
§ 371 (c)(1),
(2) Date: Jul. 27, 2017

(87) PCT Pub. No.: WO2016/122223
PCT Pub. Date: Aug. 4, 2016

(65) Prior Publication Data
US 2018/0277341 A1    Sep. 27, 2018

(30) Foreign Application Priority Data

Jan. 28, 2015  (KR) .................. 10-2015-0013556
Jul. 14, 2015  (KR) .................. 10-2015-0099731
Jul. 14, 2015  (KR) .................. 10-2015-0099822
Sep. 17, 2015  (KR) .................. 10-2015-0131751

(51) Int. Cl.
C23C 14/34   (2006.01)
H01J 37/34   (2006.01)
C23C 14/12   (2006.01)

(52) U.S. Cl.
CPC .......... *H01J 37/3429* (2013.01); *C23C 14/12* (2013.01); *C23C 14/3414* (2013.01); *H01J 37/3491* (2013.01)

(58) Field of Classification Search
CPC .. C23C 14/12; C23C 14/3414; H01J 37/3429; H01J 37/3491
USPC .......................... 204/298.12, 298.13, 192.14
See application file for complete search history.

(56) References Cited

U.S. PATENT DOCUMENTS

| 4,629,547 A | * | 12/1986 | Honda | ................... C23C 14/06 |
| | | | | 204/192.15 |
| 6,149,778 A | * | 11/2000 | Jin | ...................... H01L 23/5329 |
| | | | | 204/192.11 |
| 2009/0045051 A1 | * | 2/2009 | Ferrasse | ............. C23C 14/3407 |
| | | | | 204/298.13 |

FOREIGN PATENT DOCUMENTS

| JP | H0532810 A | | 2/1993 |
| JP | H05215905 A | | 8/1993 |
| JP | 06-306591 | * | 11/1994 |
| JP | 08-101301 | * | 4/1996 |
| JP | 2009175500 A | | 8/2009 |
| KR | 1020100120598 A | | 11/2010 |
| KR | 101016622 B1 | | 2/2011 |
| KR | 1020110108178 A | | 10/2011 |
| KR | 1020120047873 A | | 5/2012 |
| KR | 1020150007865 A | | 1/2015 |

OTHER PUBLICATIONS

Machine Translation of JP 08-101301. (Year: 1996).*
Machine Translation JP 06-306591 (Year: 1994).*
Gauch, M. et al., "Mixing of PTFE and oxides by sputtering techniques: a comparison of different approaches," Proceedings of the 2nd International Conference on System-Integrated Intelligence: Challenges for Product and Production Engineering (SysInt 2014), Jul. 2, 2014, Bremen, Germany, 9 pages.
ISA Korean Intellectual Property Office, International Search Report Issued in Application No. PCT/KR2016/000927, dated Jun. 22, 2016, WIPO, 4 pages.

* cited by examiner

*Primary Examiner* — Rodney G McDonald
(74) *Attorney, Agent, or Firm* — McCoy Russell LLP

(57) ABSTRACT

The fluoro-based polymer composite target for sputtering according to the present invention is excellent in adhesion with a metal electrode to which a voltage is applied, can prevent bending, and is capable of stably forming plasma by imparting conductivity even with industrially widely used DC and MF power supply systems, thereby allowing a fluorinated polymer to be effectively deposited on an adherend by sputtering.

2 Claims, No Drawings

FLUORO-BASED POLYMER COMPOSITE TARGET FOR SPUTTERING

CROSS-REFERENCE TO RELATED APPLICATIONS

The present application is a U.S. National Phase of International Patent Application Serial No. PCT/KR2016/000927, entitled "FLUORO-BASED POLYMER COMPOSITE TARGET FOR SPUTTERING," filed on Jan. 28, 2016. International Patent Application Serial No. PCT/KR2016/000927 claims priority to Korean Patent Application No. 10-2015-0013556, filed on Jan. 28, 2015; and to Korean Patent Application No. 10-2015-0099822, filed on Jul. 14, 2015; and to Korean Patent Application No. 10-2015-0099731, filed on Jul. 14, 2015; and to Korean Patent Application No. 10-2015-0131751, filed on Sep. 17, 2015. The entire contents of each of the above-cited applications are hereby incorporated by reference in their entirety for all purposes.

TECHNICAL FIELD

The present invention relates to a fluorinated polymer composite target for sputtering, and more particularly, to a fluorinated polymer composite target which has multifunctionality, improves joining strength to an electrode to stably form plasma and to be used in a RF sputtering process capable of stably forming plasma, and also may be rapidly deposited even with low deposition energy of MF or DC.

BACKGROUND ART

Recently, the importance of a display device is increased as the multimedia develops. In response thereto, a flat panel display device such as a liquid crystal display device, a plasma display device and an organic light emitting display device has been commercialized. In addition, as various digital devices such as a smart phone, a digital TV, a tablet PC, a laptop, a PMP and a navigation apparatus are released, the demand of a flat display panel or a touch screen has been increased.

The flat display panel may be LCD, PDP, OLED and the like. These are widely used as a display device of various digital devices due to their characteristics such as a light-weight, a thin profile, low power drive, full color and high resolution implementation. The touch screen is installed on a display surface of various flat panel displays and used as an input device so that a user selects desired information while watching the display device, and thus, the demand of the touch screen has been increased.

Since this flat display panel or touch screen has a front surface exposed to the outside, it is easy to be contaminated by moisture or a pollutant containing moisture, and when it is left for a long time and fixed in a contaminated state, it is not easy to wipe off the pollutant. Moreover, when the display panel or the touch screen gets wet, the function of the device may be adversely affected, and thus, the device should be protected from moisture.

In order to overcome the problem, a method of forming a protective film containing fluorine on the surface of these display devices to be hydrophobicized is often used. A specific example of coating a fluorinated compound for implementing a hydrophobic surface includes a method of adding a solution containing an organic silicon compound containing a fluorine substituted alkyl group to a container as it is and heating it to form a thin film of the compound on a substrate (Patent Document 001, Japanese Patent Laid-Open Publication No. 2009-175500), and a method of applying a PTFE powder (polytetrafluoroethylene) dispersion on a thermal resistant substrate, and then heating it above the melting point to bind the powder to form a thin film (Patent Document 002, Japanese Patent Laid-Open Publication No. 1993-032810). In addition, a method of heating a silazane-based organic silicon compound containing fluorine under vacuum to be deposited on an optical member, thereby forming a film (Patent Document 003, Japanese Patent Laid-Open Publication No. 1993-215905) and the like are disclosed.

However, in the case of the invention disclosed in Patent Document 001, when a raw material is heated for a predetermined time or more, the durability of the thin film is deteriorated, and thus, the thickness of the film to be produced is limited, and the thin film having high durability may not be stably produced. In the invention disclosed in Patent Document 002, available devices are limited due to a high melting point, which is the cause of a high cost, and in the invention disclosed in Patent Document 003, the raw material used as a deposition source becomes unstable before being introduced into a deposition apparatus, and thus, the thin film may not be stably produced.

In addition, another method for implementing a hydrophobic surface includes a method of using a fluorinated surfactant. In order to implement a hydrophobic surface characteristic, a fluorinated surfactant having a low molecular weight may be introduced to control a fluorocarbon portion to be exposed well on the surface, however, a problem occurs in durability. In addition, when introducing a fluorinated surfactant having a high molecular weight, durability becomes better, however, it is not preferred, since there is a difficulty in implementing hydrophobicity, and a problem occurs in the appearance of the surface due to phase separation with a coating matrix.

In order to overcome the problems, recently, a coating technique using a fluorinated polymer in a dry process, not a wet process is being developed.

The most representative example of the method of coating a fluorinated polymer by a dry process is sputtering, in which strong plasma formed on the fluorinated polymer surface imparts strong energy to the fluorinated polymer surface so that the molecular level fluorinated polymer falls off the surface to be deposited on the adherend surface on the opposite side to form a coating.

However, in the case of a sputtering target having an insulating property like a polymer resin, when a direct current power source is applied, positive charges gather on the target surface to weaken the applied voltage, thereby reducing the energy of collision particles, and thus, a deposition rate is too low, or the plasma itself is not produced. Accordingly, high energy is needed, and for this, only RF (radio frequency) sputtering power is used as a high frequency power supply system, and with low energy like MF (mid-range frequency) sputtering power or DC (direct current) sputtering Power, the plasma may not be generated well to be deposited.

In addition to this, there are still problems even when using a sputtering target having a high insulating property to perform sputtering with high energy RF. That is, the high frequency power supply system is often used, since positive (+) and negative (−) voltages are alternately applied using RF with high frequency of several tens of MHz (generally 13.56 MHz), so that when negative voltage is applied, sputtering occurs, and when positive voltage is applied, cations are prevented from being deposited on the target surface, thereby sputtering the target of the insulator without arcing. However, when sputtering a fluorinated polymer target having a high insulating property with RF, the negative voltage is not easily applied to lower the deposition rate of a thin film, which is still problematic. In order to solve this, it is essentially required to separately install a matching box which is another expensive equipment to adjust impedance (alternating current resistance), but the above problem is not completely solved, and the process cost is unduly high, so that the commercialization is still limited in terms of quality and cost.

That is, in the case of deposition using a high water-repellent and high insulating fluorinated polymer target, a RF process requiring high energy is only adopted, and in the case of adopting this, the target is damaged due to a low deposition rate and a high temperature of a target surface, and the power supply unit of applying power is expensive, the process is difficult and complicated, and thus, it is required to solve these problems.

Furthermore, the problems of arcing on a fluorinated polymer surface due to applying a RF power supply which is a high frequency power supply system in the fluorinated polymer deposition process, a damaged target due to heat, arcing between the fluorinated polymer and a metal electrode to which voltage is applied, and a low deposition rate due to plasma occurrence having low efficiency as compared with the applied voltage should be solved at the same time.

In order to solve the problems, a sputtering method using low energy such as MF or DC may be listed, however, in practice, with a conventional fluorinated polymer target for depositing an ultrahigh water-repellent and ultrahigh insulating fluorinated polymer, quality or deposition efficiency having a degree of being normally commercialized was impossible. That is, a sputtering method using a conventional fluorinated polymer target using low energy such as MF or DC has unduly low deposition efficiency or is not operated (sputtering) well, normal deposition is not performed.

However, when in the fluorinated polymer target for depositing the fluorinated polymer, a technique solving the problems of the conventional RF sputtering method, and at the same time, enabling deposition using MF (mid-range frequency) sputtering power and DC (direct current) sputtering power is developed, it is highly commercial, and is likely to be applied in various ways, and thus, development of the technique is strongly urged. Since MF and DC as described above have a relatively low frequency of several tens of KHz or less, as compared with RF having a frequency of several tens of MHz, separate impedance matching is not needed, the device is simple, and if sputtering is possible, continuous production is also possible, and thus, they are highly industrially applicable.

Thus, the present inventors developed a technique for coating a fluorinated polymer using a dry process, which is a new technique to solve the problems caused by using the conventional RF power supply, which are arcing on the surface of the fluorinated polymer, damaging a target by heat, arcing and the like between the fluorinated polymer and a metal electrode to which voltage is applied, and also a low deposition rate due to low efficient plasma generation relative to the applied voltage, and further, the technique allowing an excellent deposition rate even under low energy like DC or MF sputtering, thereby completing the present invention.

DISCLOSURE

Technical Problem

Thus, the present inventors developed a new fluorinated polymer composite target, capable of depositing a fluorinated polymer having ultrahigh water repellency, by solving the problems caused by using the conventional RF power supply, which are arcing on the surface of the fluorinated polymer, damaging a target by heat, arcing and the like between the fluorinated polymer and a metal electrode to which voltage is applied, incomplete deposition due to deviation between the electrode and the target, and also a low deposition rate due to low efficient plasma generation relative to the applied voltage, and also, by allowing deposition with excellent deposition efficiency even under low energy like DC or MF sputtering, and a method of depositing the fluorinated polymer composite target, thereby completing the present invention.

An object of the present invention is to provide a new fluorinated polymer composite target for sputtering capable of effectively sputtering a fluorinated polymer thin film having ultrahigh water repellency and high insulation even under low energy like MF or DC.

Another object of the present invention is to provide a new fluorinated polymer composite target capable of improving the problems in a RF sputtering process which had to be adopted in spite of the above various problems, and also performing stable sputtering even in a MF and DC power supply system of lower energy than RF, in a deposition process of the fluorinated polymer thin film having a demerit of not easily applying electrical energy as a representative insulator.

Specifically, the present invention is to provide a new fluorinated polymer composite target for sputtering which improves the problems of a low deposition rate by generating plasma with low efficiency as compared with applied voltage, due to a damaged fluorinated polymer target, and arcing and the like between the fluorinated polymer and a metal electrode to which voltage is applied, caused by deterioration of the fluorinated polymer from the use of radio frequency which is a high frequency in the conventional sputtering to form a non-conductive fluorinated polymer thin film requiring high energy.

Further, another object of the present invention is to provide a new fluorinated polymer composite target for sputtering capable of stably performing a sputtering process and stably forming plasma to prevent insulation breakdown of the fluorinated polymer and represent a high deposition rate, by improving poor adhesive strength which causes, for example, separation of the joining surfaces of a fluorinated polymer target placed on an electrode in a sputtering chamber. It shows a more remarkable effect particularly in a RF sputtering method.

Still another object of the present invention is to provide a method of preparing a fluorinated polymer composite target capable of stable sputtering deposition of a fluorinated polymer on an adherend even in RF (radio frequency) and also MF (mid-range frequency) or DC (direct current).

Still another object of the present invention is to provide a sputtering deposition system for using the fluorinated polymer composite target according to the present invention, and a molded body manufactured by deposition of the fluorinated polymer composite target.

Further, another object of the present invention is to provide a sputtering method using a fluorinated polymer composite target capable of stable sputtering deposition of a fluorinated polymer on an adherend. Specifically, the present invention is to provide a sputtering method including fixing the fluorinated polymer composite target in various embodiments according to the present invention in a chamber, and performing deposition by generating plasma on the fluorinated polymer composite target in any one application system selected from the group consisting of RF, MF and DC.

Technical Solution

The above problems in the RF deposition system were solved by preparing a fluorinated polymer composite target including one or more components selected from a conductive material (performing dopant) and a metallic chemical in a fluorinated polymer, and the deposition of a fluorinated polymer which has been substantially not allowed in the DC and MF deposition system is now possible by containing a conductive material or a component mixture of the conductive material and the metallic chemical in a fluorinated polymer, and the deposition is possible with a remarkable speed and high deposition efficiency, thereby completing the present invention.

That is, the present invention was completed by providing a fluorinated polymer composite target for deposition prepared by including (1) a performing dopant including any one or two or more conductive materials selected from the group consisting of conductive particles, a conductive polymer and a metal component, (2) one or more components selected from one or more metallic chemicals selected from the group consisting of metal organic materials, metal oxides, metal carbon bodies, metal hydroxides, metal carbonates, metal bicarbonates, metal nitrides, metal fluorides and the like, or (3) a component mixture of one or more components of above (1) and (2) in a fluorinated polymer.

By the above means, the fluorinated polymer composite target for sputtering according to the present invention is joined well to the electrode of a deposition chamber, so that it is not deformed by generating plasma by applying high energy like RF, and also, the fluorinated polymer may be stably deposited on an adherend with a high deposition rate, and at the same time, may be deposited on an adherend with a remarkably high deposition rate even in a MF or DC power supply system of low application energy.

When the fluorinated polymer composite target for sputtering according to an exemplary embodiment of the present invention is prepared by mixing the fluorinated polymer with a performing dopant which is one or two or more conductive materials selected from the group consisting of conductive particles, a conductive polymer, a metal component and the like, a damaged fluorinated polymer target due to deterioration of the fluorinated polymer from the use of RF (radio frequency) which is a high frequency does not occur even after long-term use, arcing between the fluorinated polymer and a metal electrode to which voltage is applied is minimized, and plasma is generated with high efficiency as compared with applied voltage, thereby having surprising effects such as a greatly increased deposition rate. In addition, it is recognized that by adopting the above configuration, the fluorinated polymer composite target imparts conductivity therein, thereby stably depositing the fluorinated polymer in RF, and also MF and DC having a lower voltage than RF, and also, sputtering deposition on an adherend is possible with a surprising speed which was impossible in the past, and insulation breakdown may be prevented, thereby completing the present invention.

In one general aspect, a fluorinated polymer composite target for sputtering includes a fluorinated polymer and a performing dopant imparting conductivity. When the performing dopant which is the conductive material is included in the present invention, a remarkable effect may be achieved in all of RF, DC and MF, and thus, the applied power is not limited.

In another general aspect, particularly in the case of the deposition in a RF system, a method of preparing a fluorinated polymer composite target includes preparing it by including (1) the performing dopant and/or (2) one or two or more metallic chemicals selected from the group consisting of metal organic materials, metal oxides, metal carbon bodies, metal hydroxides, metal carbonates, metal bicarbonates, metal nitrides, metal fluorides and the like in a fluorinated polymer. That is, in the RF application system, adhesion with an electrode may be improved only by including a metallic chemical, and the problems occurring in the target prepared by the fluorinated polymer alone may be solved, and thus, it belongs to the embodiment of the present invention. However, in the case of including the metallic chemical only, inferior effects are shown, as compared with the case including the conductive performing dopant, and thus, the conductive performing dopant or a mixture of the conductive performing dopant and the metallic chemical is more preferred in the RF application system.

In the case that deposition is performed by applying DC and MF of low deposition energy in the present invention, it is not preferred to include only the metallic chemical, since the deposition is inefficient or has significantly low efficiency, thereby substantially significantly reducing the deposition efficiency.

However, as described above, even in the case of a fluorinated polymer composite target prepared by mixing the fluorinated polymer with the metallic chemical alone, when the deposition is performed by applying RF, in which the surface of the mixture of the metallic chemical corresponds to an electrode surface (being disposed on the electrode surface), the target has much lower performance than the fluorinated polymer composite target containing the conductive performing dopant or the fluorinated polymer composite target prepared by including the component mixture of the conductive performing dopant and the metallic chemical, but exerts better performance than the conventional fluorinated polymer target composed of a fluorinated polymer only, and thus, it belongs to the category of the present invention.

Therefore, when deposition is performed by applying RF in the present invention, the fluorinated polymer composite target of the present invention includes all of the embodiments of the present invention including all of the conductive performing dopant, the metallic chemical or the component mixture thereof, however, when deposition is performed by applying lower energy than RF like DC or MF, the present invention may refer to the fluorinated polymer composite target including the conductive performing dopant or the component mixture of the conductive performing dopant and the metallic chemical.

Therefore, the fluorinated polymer composite target according to an exemplary embodiment of the present invention significantly improves surface adhesive strength of the fluorinated polymer to an electrode surface in the inside of a sputtering chamber for RF and also MF or DC sputtering, thereby serving to firmly fix the fluorinated polymer so that an electrode surface and an adhesive surface of the fluorinated polymer composite target are not deviated to deform the fluorinated polymer composite target in the course of being deposited by plasma generated by applying energy, and thus, the fluorinated polymer component to be deposited may be evenly and uniformly deposited on the adherend.

Further, conductivity may be imparted into the fluorinated polymer composite target according to the present invention, thereby stably sputtering the fluorinated polymer on the adherend with a high deposition rate in RF and also even in MF and DC of lower voltage, and effectively preventing insulation breakdown.

Hereinafter, the fluorinated polymer composite targets used in RF, MF and DC plasma application systems will not be particularly described separately, as long as they are used in an exemplary embodiment of the invention as described above.

The fluorinated polymer composite target according to an exemplary embodiment of the present invention may have a lamination gradient formed by two or more layers including a different or identical performing dopant and/or a metallic chemical, or a continuous content gradient. The gradient raises the content of the performing dopant and/or the metallic chemical in a thickness direction, and the content of the performing dopant may be reduced or vice versa in an adherend direction, but not limited thereto.

As an example of the present invention, it may be a fluorinated polymer composite target including a joining layer including a conductive performing dopant and/or a metallic chemical formed on one surface of an electrode of a deposition chamber, and a functional layer including a fluorinated polymer and a performing dopant and/or a metallic chemical formed on the other surface of the joining layer.

Therefore, the present invention may provide a fluorinated polymer composite target in contact with an electrode surface, including a performing dopant including conductive particles, a conductive polymer, a metal component or a component mixture thereof and/or a metallic chemical and a fluorinated polymer.

In the present invention, the performing dopant is not limited as long as it has conductivity, but for example, it refers to conductive particles, a conductive polymer, a metal component and the like.

In the fluorinated polymer composite target according to an exemplary embodiment of the present invention, the non-limited example of the conductive particles may be one or more selected from the group consisting of carbon nanotubes, carbon nanofiber, carbon black, graphene, graphite, carbon fiber and the like.

Further, a non-limited example of the conductive polymer in the present invention may be one or more selected from the group consisting of polyaniline, polyacetylene, polythiophene, polypyrrole, polyfluorene, polypyrene, polyazulene, polynaphthalene, polyphenylene, polyphenylene vinylene, polycarbazole, polyindole, polyazephine, polyethylene, polyethylene vinylene, polyphenylene sulfide, polyfuran, polyselenophene, polytellurophene and the like.

In the fluorinated polymer composite target according to an exemplary embodiment of the present invention, the non-limited example of the metal component may be one or more metals selected from the group consisting of Cu, Al, Ag, Au, W, Mg, Ni, Mo, V, Nb, Ti, Pt, Cr, Ta and the like.

In the fluorinated polymer composite target according to an exemplary embodiment of the present invention, the metallic chemical may further include one or more metallic chemicals selected from the group consisting of metal organic materials, metal oxides, metal carbon bodies, metal hydroxides, metal carbonates, metal bicarbonates, metal nitrides, metal fluorides and the like, and the metallic chemical is not limited, but may be for example, one or more metallic chemicals selected from the group consisting of $SiO_2$, $Al_2O_3$, ITO, IGZO, ZnO, $In_2O_3$, $SnO_2$, $TiO_2$, AZO, ATO, $SrTiO_3$, $CeO_2$, MgO, NiO, CaO, $ZrO_2$, $Y_2O_3$, $Al_2O_3$, $MgF_2$, $CuF_2$, $Si_3N_4$, CuN, AlN and the like, but not limited thereto.

Further, the fluorinated polymer of the present invention may be one or more selected from the group consisting of polytetrafluoroethylene, polychlorotrifluoroethylene, polyvinylidene difluoride, a fluorinated ethylene propylene copolymer, an ethylene tetrafluoroethylene copolymer, an ethylene chlorotrifluoroethylene copolymer, a perfluoroalkoxy copolymer, vinylfluoride homopolymer rubber, vinylfluoride copolymer rubber, vinylidene fluoride homopolymer rubber, vinylidene fluoride copolymer rubber and the like, but not limited thereto.

The fluorinated polymer composite target according to an exemplary embodiment of the present invention may contain 0.01 to 2000 parts by weight of the performing dopant and/or the metallic chemical, based on 100 parts by weight of the fluorinated polymer. When the metallic chemical is mixed with the performing dopant, the compositional ratio is not limited as long as it represents the conductivity of the present invention, and may be represented as a weight ratio of 0.1-99.9% to 99.9-0.1%, but not limited thereto.

Further, as another exemplary embodiment of the present invention, the fluorinated polymer composite target may be produced by increasing or decreasing the content of the performing dopant and/or the metallic chemical from one side surface to the other side surface, thereby forming a continuous gradient of the content of the performing dopant. The gradient may refer to a form continuously having a gradient of the content of the performing dopant content in a thickness direction between surfaces, or having a gradient by changing the content in two or more multiple layers. In particular, it is preferred to have the gradient as described in the present invention, since the fluorinated polymer composite target in which the adhesion between the electrode and the surface may be maximized, while the content of the performing dopant and/or the metallic chemical deposited on the adherend is minimized may be prepared.

In an exemplary embodiment of the present invention, when the gradient is formed in two steps, for example, the fluorinated polymer composite target may be prepared by increasing the content of the performing dopant and/or the metallic chemical in a first layer adhered to a metal electrode surface, and removing the content of the performing dopant and/or the metallic chemical or decreasing the content of those components to less than that in the first layer in a second layer having a deposited surface on the opposite side, and if desired, it is natural that the content of the components may be appropriately changed.

As an exemplary embodiment of the present invention, it is preferred that the fluorinated polymer composite target is prepared to have a gradient of the content of the performing dopant and/or the metallic chemical in a thickness direction. Particularly, the fluorinated polymer composite target is adhered on the electrode surface to have a gradient in which the content of the performing dopant and/or the metallic chemical is increased toward to the electrode surface and decreased in an adherend direction, since the adhesion to the electrode surface is improved to raise sputtering efficiency, and the adhesive surface is firmly fixed so that the fluorinated polymer composite target is not deformed, thereby improving the uniformity of the thickness deposited on the adherend upon sputtering. Of course, a conversely adhered one is also included, as long as the gradient includes the performing dopant and/or the metallic chemical.

Hereinafter, the sputtering apparatus of the present invention will be described. In another general aspect, though the sputtering apparatus of the present invention is not particularly limited, a sputtering deposition system including for example, a sputtering chamber for sputtering, a first electrode application part formed within the chamber, the fluorinated polymer composite target for sputtering according to the present invention disposed on the upper surface of the first electrode application part, a second electrode application part, and an adherend disposed between the fluorinated polymer composite target and the second electrode application part or at a proper position, is provided.

Further, an exemplary embodiment of the present invention provides a molded body manufactured using the above-described fluorinated polymer composite target. Here, the molded body may be a high-quality transparent fluorocarbon thin film having a high water contact angle.

In another general aspect, a sputtering method uses the fluorinated polymer composite target as described above to stably deposit the fluorinated polymer on an adherend. That is, specifically, the sputtering method includes fixing the fluorinated polymer composite target in a deposition chamber, and performing deposition by generating plasma on the fluorinated polymer composite target in any one application system selected from the group consisting of RF, MF and DC.

Advantageous Effects

The fluorinated polymer composite target for sputtering according to the present invention may lower a surface contact angle with a metal electrode to which voltage is applied thereby implementing excellent adhesive strength between a fluorinated polymer and an electrode, and inhibit bending resulted from strong energy to reduce joining defects between the fluorinated polymer and the electrode.

Further, the fluorinated polymer composite target for sputtering according to the present invention imparts conductivity, thereby preventing insulation breakdown of the target which may occur upon RF sputtering, and may be sputtered with a high deposition rate in RF and also MF and DC.

BEST MODE

Hereinafter, the fluorinated polymer composite target for sputtering according to the present invention will be described, however, technical terms and scientific terms used herein have the general meaning understood by those skilled in the art to which the present invention pertains unless otherwise defined, and a description for the known function and configuration obscuring the present invention will be omitted in the following description.

Generally, a target for thin film sputtering is used by fixing it to a metal electrode to which voltage is applied. As the fixing method, methods such as soldering, brazing, diffusion adhesion, mechanical bonding or epoxy bonding were used in the past, however, shear defects may be shown at the edge of the adhesive interface, or an adhesive portion is separated, due to a difference in thermal expansion rate between the target and the metal electrode. These problems may produce arc and the like between the metal electrode and the target, which produce low efficient plasma as compared with applied voltage, thereby representing low deposition efficiency.

Moreover, as the conventional fluorinated polymer target has a hydrophobic property and an insulation property, the surface contact angle of the metal electrode and the target is high, and thus, various chemical treatments should be involved in order to fix them. Further, since the fluorinated polymer target represents a very high insulating property, high frequency energy of RF (radio frequency) should be applied for sputtering, and accordingly, the fluorinated polymer target is deformed as itself, and also deformation inevitably occurs on a joining region with the electrode surface or defects in the joining region had to occur. Therefore, the deposition is not uniform on the surface of the adherend, and also the deposition efficiency is very poor.

Thus, the present applicant further conducted a study on the fluorinated polymer target for sputtering, and as a result, found that by containing one or more components selected from the group consisting of a conductive material (performing dopant) such as conductive particles, a conductive polymer and a metal component, and a metallic chemical in the fluorinated polymer target, high joining strength to an electrode may be imparted, thereby not causing deformation even in the conventional deposition using RF, and forming uniform deposition on the adherend, and also, performing deposition very well with excellent deposition efficiency even in an industrially useful power supply system such as MF and DC, and thus, completed the present invention.

The present invention is to provide a fluorinated polymer composite target for sputtering containing a performing dopant and/or a metallic chemical with a fluorinated polymer.

Further, the present invention is to provide a fluorinated polymer composite target having a continuous gradient of increased or decreased content of the performing dopant and/or the metallic chemical from one side surface to the other side surface. The gradient may be formed so that the content of the performing dopant and/or the metallic chemical is continuously changed in the thickness direction between the surfaces of the fluorinated polymer composite target, or in two or more multiple layers, the content of the performing dopant and/or the metallic chemical in each layer is changed, and this may be prepared by being adjusted according to various purposes or functions.

Further, in the fluorinated polymer composite target having the gradient in the present invention, the portion having a high content of the performing dopant and/or the metallic chemical is joined to the electrode, and the other surface is deposited to be bonded to the adherend. Further, when forming the stepwise gradient, for example, forming a two-step gradient in a fluorinated polymer composite target thickness direction, the thickness of the portion in contact with the electrode surface (joining layer) may be 1 to 80%, preferably 5 to 20%, based on the total thickness of the fluorinated polymer composite target, but not limited thereto. Here, the adherend refers to a substrate on which the fluorinated polymer is deposited by the fluorinated polymer composite target.

Of course, the fluorinated polymer composite target having a stepwise gradient with two layers includes the performing dopant and/or the metallic chemical in the layer in contact with the electrode surface, but may have only the fluorinated polymer not including the performing dopant and/or the metallic chemical in a second layer which is the deposited portion on the other surface (functional layer), in the RF deposition system. Further, the first and second layers may also have the same component and content of the performing dopant, and usually it is preferred to include the performing dopant having conductivity in the first layer in contact with the electrode surface, but not limited thereto.

The fluorinated polymer composite target according to an exemplary embodiment of the present invention may include 0.01 to 2000 parts by weight of one or more conductive materials selected from the group consisting of the conductive particles, the conductive polymer, the metal component and the like, based on 100 parts by weight of the fluorinated polymer, and for having excellent adhesive strength, preferably 0.5 to 1500 parts by weight, more preferably 1 to 1000 parts by weight is included.

Hereinafter, the exemplary embodiments of the present invention will be shown, and these only show several forms for understanding well and describing the present invention, and within the scope of the technical idea of the present invention, various modifications may be carried out, and thus, the present invention may not be interpreted by being limited thereto.

A first exemplary embodiment of the present invention provides a fluorinated polymer composite target including a performing dopant which is a conductive material selected from the group consisting of conductive particles, a conductive polymer, a metal component and the like.

A second exemplary embodiment of the present invention provides a fluorinated polymer composite target further including one or more metallic chemicals selected from the group consisting of metal organic materials, metal oxides, metal carbon bodies, metal hydroxides, metal carbonates, metal bicarbonates, metal nitrides, metal fluorides and the like.

A third exemplary embodiment of the present invention includes a fluorinated polymer composite target including only a metallic chemical in the case of the deposition with a RF application system.

A fourth exemplary embodiment of the present invention includes a fluorinated polymer composite target having a continuous gradient of a changed content of the performing dopant and/or the metallic chemical in a thickness direction of the fluorinated polymer composite target, or a stepwise gradient in multiple layers.

The fifth exemplary embodiment of the present invention includes a functional layer which is a fluorinated polymer layer including the performing dopant and/or the metallic chemical in a direction in contact with the electrode surface, and not including the performing dopant and/or the metallic chemical on the opposite surface of the fluorinated polymer composite target, in the fourth exemplary embodiment in the RF application system.

The sixth exemplary embodiment of the present invention, the performing dopant and/or the metallic chemical components in each layer of the fluorinated polymer composite target having a laminated type gradient formed by the plural layers may be identical or different, in the fourth exemplary embodiment.

In the specific seventh exemplary embodiment of the present invention, the fluorinated polymer composite target necessarily includes the performing dopant which is a conductive material in the MF or DC application system, in the specific seventh exemplary embodiment of the present invention.

As described above, the fluorinated polymer composite target of the present invention includes one or two or more performing dopants selected from the group consisting of the conductive particles, the conductive polymer, the metal component and the like and/or the metal chemical in the fluorinated polymer, thereby lowering the surface contact angle with the electrode to which voltage is applied to have high surface energy, and thus, surprisingly, even in the case of applying high energy, the fluorinated polymer composite target is not deformed. Further, even in a power supply system such as MF or DC, the deposition is easily performed by the role of the performing dopant, and the deposition efficiency is greatly increased.

The fluorinated polymer composite target according to an exemplary embodiment of the present invention contains a performing dopant which is a conductive material in the fluorinated polymer having an insulation property, thereby imparting conductivity to the fluorinated polymer composite target. Thus, surprisingly, the sputtering is possible even in the MF or DC power supply system, and also the plasma formation efficiency is increased, thereby implementing a high deposition rate.

The fluorinated polymer according to an exemplary embodiment of the present invention is not limited as long as it is a resin containing fluorine, however, may be preferably one or more selected from one or more fluorinated polymer selected from the group consisting of polytetrafluoroethylene (PTFE), polychlorotrifluoroethylene (PCTFE), polyvinylidene difluoride (PVDF), fluorinated ethylene propylene copolymer (FEP), an ethylene tetrafluoroethylene copolymer (ETFE), an ethylene chlorotrifluoroethylene copolymer (ECTFE), a perfluoroalkoxy copolymer (PFA), and the like; and one or more fluorine rubber selected from the group consisting of vinylfluoride homopolymer rubber, vinylfluoride copolymer rubber, vinylidene fluoride homopolymer rubber, vinylidene fluoride copolymer rubber and the like, and more preferably, may be polytetrafluoroethylene (PTFE), a fluorinated ethylene propylene copolymer (FEP), a perfluoroalkoxy copolymer (PFA) and the like, but not limited thereto.

In the present invention, a specific example of the metal component may be Cu, Al, Ag, Si, Au, W, Mg, Ni, Mo, V, Nb, Ti, Pt, Cr, Ta and the like, preferably Cu, Al, Ag, Si, Au, W, Mg or a metal mixture thereof, but not limited thereto.

Further, the conductive particles and the conductive polymer are not limited as long as they have conductivity, and a non-limited example of the conductive particles may be carbon nanotubes, carbon nanofiber, carbon black, graphene, graphite, carbon fiber or a mixture thereof, and other organic conductive particles may be included. Here, it is preferred to use the carbon-based conductive particles as an example of the conductive particles, since conductivity may be imparted while the fluorocarbon component is maintained.

Further, a non-limited example of the conductive polymer may be one or more selected from the group consisting of polyaniline, polyacetylene, polythiophene, polypyrrole, polyfluorene, polypyrene, polyazulene, polynaphthalene, polyphenylene, polyphenylene vinylene, polycarbazole, polyindole, polyazephine, polyethylene, polyethylene vinylene, polyphenylene sulfide, polyfuran, polyselenophene, polytellurophene and the like, but not limited thereto.

A specific example of the metallic chemical of the present invention may be one or more selected from the group consisting of $SiO_2$, $Al_2O_3$, ITO, IGZO, ZnO, $In_2O_3$, $SnO_2$, $TiO_2$, AZO, ATO, $SrTiO_3$, $CeO_2$, MgO, NiO, CaO, $ZrO_2$, $Y_2O_3$, $Al_2O_3$, $MgF_2$, $CuF_2$, $Si_3N_4$, CuN, AlN and the like, but not limited thereto.

As described above, as the kind and content of the performing dopant and/or the metallic chemical are adjusted, the functional layer of the fluorinated polymer composite target may further impart a functionality of a thin film formed by using them.

More specifically, the thin film formed by using the fluorinated polymer composite target according to an exemplary embodiment of the present invention may basically maintain ultrahigh hydrophobicity and high transparency, have excellent optical properties, and excellent pollution prevention, anti-reflection, chemical resistance, lubrication and the like, and also remarkably improve the physical properties such as conductivity and strength of the prepared thin film depending on the kind or content of the fluorinated polymer and the performing dopant and/or the metallic chemical. Further, the fluorinated polymer composite target may be sputtered in lower voltage due to improved conductivity in the target, and prepare a high quality fluorocarbon-containing thin film at a low cost.

This is because conductivity is imparted to the fluorinated polymer composite target according to the present invention, differently from the conventional process requiring to apply a high frequency power supply in order to sputter the fluorinated polymer target, thereby allowing smooth sputtering in RF (radio frequency) and also MF (midrange frequency) or DC (direct current), and also, having very high sputtering efficiency.

A preparation example of the fluorinated polymer composite target according to the exemplary embodiment of the present invention will be described, as follows.

The fluorinated polymer composite target having a two-step gradient or a gradient of forming multiple layers may be prepared by a method including preparing a first mixture by mixing a fluorinated polymer and a performing dopant having conductivity which is one or two or more selected from the group consisting of conductive particles, a conductive polymer and a metal component and/or a metallic chemical at a certain mixing ratio, preparing a second mixture by mixing the fluorinated polymer and the performing dopant identical to or different from the performing dopant included in the first mixture and/or the metallic chemical at a certain mixing ratio, and preparing a target by subjecting the first mixture and the second mixture to compression molding and heat treatment. In the case that the kind and the mixing ratio of performing dopant and/or metallic chemical of the first mixture and the second mixture are identical, the step of preparing the second mixture may not be carried out.

Further, in the case that the fluorinated polymer composite target has a continuous gradient, the performing dopant or a mixture of the performing dopant and the metallic chemical are weakly vibrated on the fluorinated polymer powder layer so that the performing dopant on the surface is infiltrated, and then compression heat treatment is carried out, thereby preparing the fluorinated polymer composite target having a continuous gradient. Here, the fluorinated polymer composite target according to the present invention is characterized by including the performing dopant necessarily having conductivity and/or the metallic chemical in the surface adhered to the electrode surface within the sputtering chamber. Here, in the case of the MF and DC application system, the conductive performing dopant should be included on the opposite surface of the electrode to which the fluorinated polymer composite target is adhered, and it is preferred to include the performing dopant and/or the metallic chemical in the electrode surface, and in an extreme case, the fluorinated polymer composite target having a laminate or gradient not including this component does not have a remarkably good deposition effect due to poor adhesion with the electrode, but has an excellent increase effect in the deposition speed, and thus, may be included in the present invention.

In the above-described method, it is natural that the mixing ratio of the first mixture and the second mixture may be adjusted as required, and in terms of imparting the adhesive strength and conductivity to the metal electrode, the first mixture forming the joining layer facing the electrode surface may contain 0.1 to 2000 parts by weight, preferably 10 to 1000 parts by weight, more preferably 20 to 500 parts by weight of one or more performing dopant selected from the group consisting of conductive particles, a conductive polymer and a metal component and/or the metal chemical, based on 100 parts by weight of the fluorinated polymer, but not limited thereto.

In the fluorinated polymer composite target according to an exemplary embodiment of the present invention, the second mixture forming the functional layer disposed on the opposite surface of the electrode surface may contain 0.1 to 1000 parts by weight of the component which is identical to or different from the component of the joining layer, based on 100 parts by weight of the fluorinated polymer, and in terms of high conductivity and for improving the durability of the thin film manufactured using it, 0.1 to 300 parts by weight is preferred, and 0.1 to 100 parts by weight is more preferred, but not limited thereto.

Further, the conductive particles, the conductive polymer, the metal component and the metallic chemical are not limited as long as they have a size to have proper miscibility and a uniform composition with the fluorinated polymer powder, however, it is preferred to have an average particle size of preferably 10 nm to 1000 μm, more preferably 10 nm to 100 μm, but not limited thereto.

Further, the compression molding is not limited, but may be carried out preferably at 100 to 500 kgf/cm$^2$, and in terms of implementing a uniform and smooth target surface, it may be carried out at 150 to 400 kgf/cm$^2$, and though the heat treatment is not limited in the desired scope of the present invention, it may be carried out preferably at 250 to 450° C., and the compression molding and heat treatment time may be properly adjusted depending on the shape and size of the mold, of course.

The fluorinated polymer composite target having higher conductivity according to an exemplary embodiment of the present invention may allow deposition with a high deposition rate in RF voltage and also MF or DC voltage, have excellent plasma forming efficiency to allow stable sputtering deposition on the adherend, and when depositing a thin film, a high deposition rate may be implemented, and insulation breakdown due to the application of the conventional voltage of high energy may be prevented.

The adherend according to an exemplary embodiment of the present invention may be selected from the group consisting of silicone, metal, ceramic, resin, paper, glass, crystal, fiber, plastic, an organic polymer and the like, but not limited thereto. Further, the shape of the electrode according to the present invention is not limited, and a uniform and smooth thin film may be formed even when it is applied on the metal electrode having a nonuniform surface.

As described above, the conventional fluorinated polymer target should be subjected to sputtering by applying high energy voltage of a high frequency due to the insulation property of the fluorinated polymer, and thus, uniform sputtering was impossible by deformation, and the adhesive strength to the metal electrode to which voltage is applied is week so that some problems such as arc between the metal electrodes occur to have a low thin film deposition rate, and thus, there was difficulty in a mass production application.

Thus, the present invention may improve the conventional target defects due to applying high energy voltage, and implement the same thin film even in the MF or DC power supply system. Further, the present invention may implement a roll-to-roll process which allows manufacture of a large area thin film within a short time, may be directly applied by exchanging the target without an additional modification cost in the conventional roll-to roll equipment, and thus, is highly commercial, and may allow process simplification and manufacturing cost reduction.

The present invention provides a sputtering method including fixing the fluorinated polymer composite target according to the above-described various embodiments in a chamber, and applying RF, DC and MF to the fluorinated polymer composite target to perform deposition. Here, RF, MF and DC which are applied voltage used in the sputtering method were performed at 13.56 MHz, 50 KHz and 100 V, respectively, but these only correspond to an exemplary embodiment of the present invention, and are not limited thereto.

Further, the present invention provides a molded body manufactured by the above-described fluorinated polymer composite target. Here, the molded body may be a high quality transparent fluorocarbon thin film having a high water contact angle, and depending on the kind and content of performing dopant to be added, thin films having various physical properties may be manufactured.

Hereinafter, the present invention will be described in detail by the following Examples. However, the following Examples are only to assist in the understanding of the present invention, and the scope of the present invention is not limited thereto in any sense.

In the present invention, the physical properties of the fluorinated polymer composite target and the manufactured thin film were measured as follows:

1. Contact Angle Measurement

The water contact angle of the completed thin film was measured using a contact angle analyzer (PHOENIX 300 TOUCH, SEO).

2. Visible Light Transmittance Measurement

The completed thin film was irradiated with light using a spectrophotometer (U-4100, Hitachi) to measure the visible light transmittance (550 nm).

3. Target Adhesive Strength

The completed target was adhered using a Cu backing plate and a Si elastomer (Hankel, Loctite ABLESTIK ICP 4298) and the adhesion retention time was measured.

4. Target Surface Sheet Resistance

The surface sheet resistance of the completed target was measured using a 4-point probe (MCP-T610, Mitsubishi Chemical Analytech).

Example 1

A joining layer (thickness of 1.0 mm) joined to the electrode surface, using 20 wt % of PTFE powder (polytetrafluoroethylene, DuPont 7AJ) and 80 wt % of copper powder (average particle diameter of 25 um), and a functional layer which is a deposition layer having a thickness of 5.0 mm formed on the joining layer, using 80 wt % of PTFE and 20 wt % of copper powder were sequentially added to the top of a mold (width of 120 mm, length of 55 mm and thickness of 30 mm), and processed by compression molding under the condition of 300 kgf/cm$^2$, and heat treatment at 370° C., and then slowly cooling, thereby preparing a fluorinated polymer composite target (diameter of 4 inches and thickness of 6 mm).

The thus-prepared fluorinated polymer composite target was used to deposit a thin film by RF (radio frequency) magnetron sputtering. Here, as a substrate, a Si wafer substrate having a size of 1×2 cm$^2$ was prepared by washing using an ultrasonic washer with acetone and alcohol for 5 minutes, respectively, and drying. The prepared substrate was adhered to a substrate holder manufactured with aluminum using a heat resistant tape, the substrate holder was mounted on a substrate stage in the chamber, then the chamber was closed, vacuum was applied to 50 mtorr with a rotary pump, a low vacuum operation was completed, and then a high vacuum was formed with a cryogenic pump. A distance between the substrate and the target at room temperature (25° C.) was set to 24 cm, and a 100 nm thin film was manufactured with power (200 W) and gas (Ar) partial pressure (10 mtorr).

In order to confirm the physical properties of the thin film manufactured by the above method, a contact angle, a visible light transmittance, target adhesive strength, and the surface sheet resistance of the target were measured, and the results thereof are shown in Table 1. As a result, the fluorinated polymer composite target manufactured by the above method had remarkably increased adhesion retention time to the electrode, and it was seen therefrom that excellent deposition efficiency may be implemented. It may be recognized that this is a completely different, surprising effect, as compared with the result of Comparative Example 1 which is the target of the fluorinated polymer only, having poor adhesive strength with the electrode to be incompletely deposited.

In addition, when depositing a thin film by RF (radio frequency) magnetron sputtering, in order to confirm the effect depending on the power value, thin film deposition rates at 200 W and 300 W were confirmed, and the results are shown in Table 2. As a result, the thin film deposition efficiency was shown to be 2.0 times and 2.63 times, respectively (difference in a deposition thickness) with the same time and the same applying energy, as compared with Comparative Example 1 not using the copper component.

Example 2

A fluorinated polymer composite target (diameter of 4 inches and thickness of 6 mm) having a joining layer (thickness of 1.0 mm) using 20 wt % of PTFE (polytetrafluoroethylene) and 80 wt % of copper and a functional layer (thickness of 5.0 mm) using 100 wt % of PTFE (polytetrafluoroethylene) on the joining layer was prepared, and a 100 nm thin film was manufactured in the same manner as in Example 1 above.

In order to confirm the physical properties of the thin film manufactured in the same manner as Example 1 above, a contact angle, a visible light transmittance, target adhesive strength, and the surface sheet resistance of the target were measured, and the results thereof are shown in Table 1.

Example 3

80 wt % of PTFE powder (polytetrafluoroethylene) and 20 wt % of silver (Ag) were uniformly mixed, added to the top of a mold (width of 120 mm, length of 55 mm and thickness of 30 mm), and compression-molded under a condition of 300 kgf/cm$^2$, and processed by heat treatment at 370° C. and then slowly cooling, thereby preparing a fluorinated polymer composite target (diameter of 4 inches and thickness of 6 mm), and then a 100 nm thin film was manufactured in the same manner as Example 1 above.

In order to confirm the physical properties of the thin film manufactured in the same manner as Example 1 above, a contact angle, a visible light transmittance, target adhesive strength, and the surface sheet resistance of the target were measured, and the results thereof are shown in Table 1.

Example 4

80 wt % of PTFE powder (polytetrafluoroethylene, DuPont 7AJ), 10 wt % of copper (average diameter of 25 um), and 10 wt % of $TiO_2$ (average diameter of 20 um) were uniformly mixed, added to the top of a mold (width of 120 mm, length of 55 mm and thickness of 30 mm), and compression-molded under a condition of 300 kgf/cm², and processed by heat treatment at 370° C. and then slowly cooling, thereby preparing a fluorinated polymer composite target (diameter of 4 inches and thickness of 6 mm), and then a 100 nm thin film was manufactured in the same manner as Example 1 above.

In order to confirm the physical properties of the thin film manufactured in the same manner as Example 1 above, a contact angle, a visible light transmittance, target adhesive strength, and the surface sheet resistance of the target were measured, and the results thereof are shown in Table 1.

Example 5

80 wt % of PTFE powder (polytetrafluoroethylene, DuPont 7AJ) and 20 wt % of silicon metal (Si, average diameter of 20 um) were uniformly mixed, added to the top of a mold (width of 120 mm, length of 55 mm and thickness of 30 mm), and compression-molded under a condition of 300 kgf/cm², and processed by heat treatment at 370° C. and then slowly cooling, thereby preparing a fluorinated polymer composite target (diameter of 4 inches and thickness of 6 mm), and then a 100 nm thin film was manufactured in the same manner as Example 1 above.

In order to confirm the physical properties of the thin film manufactured in the same manner as Example 1 above, a contact angle, a visible light transmittance, target adhesive strength, and the surface sheet resistance of the target were measured, and the results thereof are shown in Table 1.

Example 6

80 wt % of PFA powder (perfluoroalkoxy copolymer, 3M Dyneon PFA 6503) and 20 wt % of alumina ($Al_2O_3$) were uniformly mixed, added to the top of a mold (width of 120 mm, length of 55 mm and thickness of 30 mm), and compression-molded under a condition of 300 kgf/cm², and processed by heat treatment at 370° C. and slow cooling, thereby preparing a fluorinated polymer composite target (diameter of 4 inches), and the results are shown in Table 1. Here, when manufacturing a thin film using the fluorinated polymer composite target of the composition, the deposition rate was somewhat lower, and thus, it took twice as much as the deposition time of Example 1 to form a thin film having the same thickness.

Example 7

80 wt % of FEP powder (Fluorinated Ethylene Propylene Copolymer, 3M Dyneon FEP 6338Z) and 20 wt % of carbon black were uniformly mixed, added to the top of a mold (width of 120 mm, length of 55 mm and thickness of 30 mm), and compression-molded under a condition of 300 kgf/cm², and processed by heat treatment at 370° C. and then slowly cooling, thereby preparing a fluorinated polymer composite target (diameter of 4 inches and thickness of 6 mm), and then a 100 nm thin film was manufactured in the same manner as Example 1 above.

In order to confirm the physical properties of the thin film manufactured in the same manner as Example 1 above, a contact angle, a visible light transmittance, target adhesive strength, and the surface sheet resistance of the target were measured, and the results thereof are shown in Table 1.

In addition, when depositing a thin film by RF (radio frequency) magnetron sputtering, in order to confirm the effect depending on the power value, thin film deposition rates at 200 W and 300 W were confirmed, and the results are shown in Table 2. As a result, the thin film deposition efficiency was shown to be 2.59 times and 2.86 times, respectively (difference in a deposition thickness) with the same time and the same applying energy, as compared with Comparative Example 1 not using the carbon black component.

Example 8

A joining layer (thickness of 1.0 mm) joined to the electrode surface, using 20 wt % of PTFE powder (polytetrafluoroethylene, DuPont 7AJ) and 80 wt % of copper powder (average particle diameter of 25 um), and a functional layer which is a deposition layer having a thickness of 5.0 mm formed on the joining layer, using 85 wt % of PTFE and 15 wt % of carbon nanotubes were sequentially added to the top of a mold (width of 120 mm, length of 55 mm and thickness 30 mm), and processed by compression molding under the condition of 300 kgf/cm², and heat treatment at 370° C., and then slowly cooling, thereby preparing a fluorinated polymer composite target (diameter of 4 inches and thickness of 6 mm).

The prepared fluorinated polymer composite target was used to deposit a thin film in a DC (direct current) magnetron sputtering power supply system. Here, as a substrate, a Si wafer substrate having a size of 1×2 cm² was prepared by washing using an ultrasonic washer with acetone and alcohol for 5 minutes, respectively, and drying. The prepared substrate was adhered to a substrate holder manufactured with aluminum using a heat resistant tape, the substrate holder was mounted on a substrate stage in the chamber, then the chamber was closed, vacuum was applied to 50 mtorr with a rotary pump, a low vacuum operation was completed, and then a high vacuum was formed with a cryogenic pump. A distance between the substrate and the target at room temperature (25° C.) was set to 24 cm, and a 100 nm thin film was manufactured with power (200 W) and gas partial pressure (10 mtorr).

In order to confirm the physical properties of the thin film manufactured by the above method, a contact angle, a visible light transmittance, target adhesive strength, and the surface sheet resistance of the target were measured, and the results thereof are shown in Table 1. As a result, it was recognized that the fluorinated polymer composite target prepared by the above method sufficiently maintains conductivity with excellent adhesion retention time and sheet resistance, while remarkably increasing the adhesion retention time to the electrode. It may be recognized that this is a completely different, surprising effect, as compared with the result of Comparative Example 1 which is the target of the fluorinated polymer only, not representing conductivity to be substantially not deposited, or incompletely deposited.

In addition, when depositing a thin film by DC (direct current) magnetron sputtering, in order to confirm the effect depending on the power value, thin film deposition rates at 200 W and 300 W were confirmed, and the results are shown in Table 2. As a result, the thin film deposition efficiency was shown to be 6.6 times and 9 times, respectively (difference in a deposition thickness) with the same time and the same applying energy, as compared with Comparative Example 1 not using the carbon nanotubes and copper component.

Example 9

The fluorinated polymer composite target of Example 8 above was used to manufacture a 100 nm thin film in the same manner as in Example 8 under a condition of 200 W power in a MF (mid-range frequency) magnetron sputtering power supply system.

In order to confirm the physical properties of the thin film manufactured by the above method, a contact angle, a visible light transmittance, target adhesive strength, and the surface sheet resistance of the target were measured, and the results thereof are shown in Table 1.

In addition, when depositing a thin film by MF (mid-range frequency) magnetron sputtering, in order to confirm the effect depending on the power value, thin film deposition rates at 200 W and 300 W were confirmed, and the results are shown in Table 2. As a result, the thin film deposition efficiency was shown to be 3.2 times and 3.3 times, respectively (difference in a deposition thickness) with the same time and the same applying energy, as compared with Comparative Example 1 not using the carbon nanotubes and copper component.

Example 10

85 wt % of PTFE powder (polytetrafluoroethylene, DuPont 7AJ) and 15 wt % of graphite were used to prepare a fluorinated polymer composite target (diameter of 4 inches and thickness of 6 mm). In addition, a 100 nm thin film was manufactured under a 200 W condition in a MF power supply system as in Example 9.

In order to confirm the physical properties of the thin film manufactured by the above method, a contact angle, a visible light transmittance, target adhesive strength, and the surface sheet resistance of the target were measured, and the results thereof are shown in Table 1.

Example 11

90 wt % of FEP powder (Fluorinated Ethylene Propylene Copolymer, 3M Dyneon FEP 6338Z) and 10 wt % of carbon nanotubes were used to prepare a fluorinated polymer composite target (diameter of 4 inches and thickness of 6 mm). In addition, a 100 nm thin film was manufactured under a 200 W condition in a MF power supply system as in Example 9.

In order to confirm the physical properties of the thin film manufactured by the above method, a contact angle, a visible light transmittance, target adhesive strength, and the surface sheet resistance of the target were measured, and the results thereof are shown in Table 1.

Example 12

80 wt % of PTFE powder (polytetrafluoroethylene, DuPont 7AJ), 10 wt % of carbon nanotubes and 10 wt % of silica oxide ($SiO_2$) were used to prepare a fluorinated polymer composite target (diameter of 4 inches and thickness of 6 mm). In addition, a 100 nm thin film was manufactured under a 200 W condition in a MF power supply system as in Example 9.

In order to confirm the physical properties of the thin film manufactured by the above method, a contact angle, a visible light transmittance, target adhesive strength, and the surface sheet resistance of the target were measured, and the results thereof are shown in Table 1.

Example 13

60 wt % of PFA powder (perfluoroalkoxy copolymer, 3M Dyneon PFA 6503), 30 wt % of PTFE powder (polytetrafluoroethylene, DuPont 7AJ), and 10 wt % of carbon nanotubes were used to prepare a fluorinated polymer composite target (diameter of 4 inches and thickness of 6 mm). In addition, a 100 nm thin film was manufactured under a 300 W condition in a MF power supply system as in Example 9.

In order to confirm the physical properties of the thin film manufactured by the above method, a contact angle, a visible light transmittance, target adhesive strength, and the surface sheet resistance of the target were measured, and the results thereof are shown in Table 1.

Example 14

99 wt % of PFA powder (perfluoroalkoxy copolymer, 3M Dyneon PFA 6503) and 1 wt % of carbon nanotubes were used to prepare a fluorinated polymer composite target (diameter of 4 inches and thickness of 6 mm). In addition, a 100 nm thin film was manufactured under a 200 W condition in a MF power supply system as in Example 9.

In order to confirm the physical properties of the thin film manufactured by the above method, a contact angle, a visible light transmittance, target adhesive strength, and the surface sheet resistance of the target were measured, and the results thereof are shown in Table 1.

Example 15

95 wt % of PTFE powder (polytetrafluoroethylene, DuPont 7AJ) and 5 wt % of polypyrrole, and further, 0.1 mol % of DBSA (Dodecyl Benzene Sulfonic Acid) as a dopant were used to prepare a fluorinated polymer composite target (diameter of 4 inches and thickness of 6 mm). In addition, a 100 nm thin film was manufactured under a 200 W condition in a MF power supply system as in Example 9.

In order to confirm the physical properties of the thin film manufactured by the above method, a contact angle, a visible light transmittance, target adhesive strength, and the surface sheet resistance of the target were measured, and the results thereof are shown in Table 1.

Example 16

A fluorinated polymer composite target (diameter of 4 inches and thickness of 6 mm) was prepared in the same manner as Example 8, except that the composition of the functional layer is changed to 65 wt % of PTFE, 15 wt % of carbon nanotube, and 20 wt % of silver (Ag). In addition, a 100 nm thin film was manufactured under a 200 W condition in a MF power supply system as in Example 9.

In order to confirm the physical properties of the thin film manufactured by the above method, a contact angle, a visible light transmittance, target adhesive strength, and the surface sheet resistance of the target were measured, and the results thereof are shown in Table 1.

Comparative Example 1

100 wt % of PTFE (polytetrafluoroethylene) was uniformly mixed in a reaction vessel, added to the top of a mold (width of 120 mm, length of 55 mm and thickness of 30 mm), and compression-molded under a condition of 300 kgf/cm², and processed by heat treatment at 370° C. and then slowly cooling, thereby preparing a fluorinated polymer target (diameter of 4 inches and thickness of 6 mm).

The fluorinated polymer target prepared by the above method was used to deposit a thin film by a RF (radio frequency) magnetron sputtering. Here, a 100 nm thin film was manufactured in the same manner as described in Example 1.

In addition, sputtering was attempted with the same target by the MF and DC systems, however, thin film deposition was impossible since plasma discharge did not occur.

In order to confirm the physical properties of the thin film prepared by the above method, a contact angle, visible light transmission, target adhesion strength and surface sheet resistance of the target were measured, and the results are shown in Table 1. When depositing a thin film by the RF (radio frequency) magnetron sputtering, the thin film deposition rates at 200 W and 200 W were confirmed in order to confirm the effect depending on the power value, and the results are shown in Table 2.

TABLE 2

|  | Example 1 RF | Example 7 RF | Example 8 DC | Example 9 MF | Comparative Example 1 RF |
|---|---|---|---|---|---|
| Power 200 W | 190 nm/hr | 250 nm/hr | 630 nm/hr | 310 nm/hr | 95 nm/hr |
| Power 300 W | 570 nm/hr | 630 nm/hr | 1980 nm/hr | 740 nm/hr | 220 nm/hr |

As shown in the above Table 2, it was confirmed that by using the fluorinated polymer composite target according to the present invention having improved adhesive strength to the electrode of the deposition chamber, the fluorinated polymer may not be deformed and be stably fixed even in the case of applying high energy to generate plasma, and also by imparting conductivity, the present invention has improved plasma efficiency to show a much higher deposition rate to the adherend.

That is, the fluorinated polymer composite target according to the present invention solves the problems occurring upon the conventional RF sputtering, and at the same time,

TABLE 1

|  | Example | | | | | | | | |
|---|---|---|---|---|---|---|---|---|---|
|  | 1 | 2 | 3 | 4 | 5 | 6 | 7 | 8 | 9 |
| Power supply system | | | | | | | | | |
|  | RF | | | | | | | DC | MF |
| Contact angle (°) | 105 | 112 | 100 | 110 | 111 | 113 | 115 | 105 | 109 |
| Transmission (%) | 92.13 | 91.11 | 91.47 | 91.35 | 92.27 | 92.14 | 91.00 | 91.90 | 92.40 |
| Adhesion Retention time | >30 hr | >30 hr | >30 hr | >20 hr | >20 hr | >15 hr | >20 hr | >30 hr | >30 hr |
| Sheet resistance of target | 100 | ∞ | 250 | ∞ | ∞ | ∞ | 10 | 0.3 | 0.3 |

|  | Example | | | | | | | Comparative Example |
|---|---|---|---|---|---|---|---|---|
|  | 10 | 11 | 12 | 13 | 14 | 15 | 16 | 1 |
| Power supply system | | | | | | | | |
|  | MF | | | | | | | RF |
| Contact angle (°) | 110 | 115 | 113 | 116 | 115 | 114 | 112 | 105 |
| Transmission (%) | 90.70 | 91.70 | 92.50 | 92.16 | 92.57 | 92.34 | 91.98 | 91.20 |
| Adhesion Retention time | >20 hr | >20 hr | >20 hr | >20 hr | >20 hr | >10 hr | >20 hr | No adhesion |
| Sheet resistance of target | 60 | 150 | 5 | 7 | 100 | 200 | 0.1 | ∞ |

As seen from the above Table 1, it was confirmed that the fluorinated polymer composite target according to the present invention has a high surface contact angle and excellent visible light transmission, and also contains a performing dopant having conductivity including conductive particles, thereby having excellent adhesive strength to a metal electrode and sheet resistance, and thus, a fluorinated polymer composite target for sputtering having improved sputtering efficiency may be prepared.

In addition, the fluorinated polymer composite target according to the present invention was not deformed even after sputtering by applying high energy, however, in Comparative Example 1, the bending degree of the target was high so that it was recognized even with the naked eye that the joining property to a metal electrode was deteriorated.

allows deposition even with MF or DC magnetron sputtering having lower energy, and shows a much higher deposition rate than the RF power supply system.

The invention claimed is:

1. A sputtering method using a fluorinated polymer composite target, comprising:
   sputter processing the fluorinated polymer composite target in a deposition chamber; and
   performing deposition by generating plasma in any one application system selected from the group consisting of DC (direct current) and MF (mid-range frequency) on the fluorinated polymer composite target,
   wherein the fluorinated polymer composite target comprises a fluorinated polymer, a conductive particle, and optionally a metallic chemical, and
   wherein the conductive particle is one or more selected from the group consisting of carbon nanotubes, carbon nanofibers, carbon black, graphene, and carbon fibers; and the metallic chemical is one or more selected from the group consisting of metal organic materials, metal oxides, metal carbon bodies, metal hydroxides, metal carbonates, metal bicarbonates and metal nitrides.

2. The method of claim 1, wherein the fluorinated polymer is one or more selected from the group consisting of polytetrafluoroethylene, polychlorotrifluoroethylene, polyvinylidene difluoride, a fluorinated ethylene propylene copolymer, an ethylene tetrafluoroethylene copolymer, an ethylene chlorotrifluoroethylene copolymer, a perfluoroalkoxy copolymer, vinylfluoride homopolymer rubber, vinylfluoride copolymer rubber, vinylidene fluoride homopolymer rubber and vinylidene fluoride copolymer rubber.

* * * * *